US011264816B2

(12) United States Patent
Horita et al.

(10) Patent No.: US 11,264,816 B2
(45) Date of Patent: Mar. 1, 2022

(54) MOBILE DEVICE INCLUDING DRIVE CIRCUIT DRIVEN BY ELECTROLYTE BATTERY OR ALL-SOLID BATTERY

(71) Applicant: SEIKO EPSON CORPORATION, Tokyo (JP)

(72) Inventors: Ryohei Horita, Nagano (JP); Nobuaki Ito, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/942,806

(22) Filed: Jul. 30, 2020

(65) Prior Publication Data

US 2021/0036526 A1 Feb. 4, 2021

(30) Foreign Application Priority Data

Aug. 1, 2019 (JP) .............................. JP2019-142081

(51) Int. Cl.
| | | |
|---|---|---|
| *H01M 10/46* | (2006.01) | |
| *H02J 7/00* | (2006.01) | |
| *H05K 5/00* | (2006.01) | |
| *G06K 15/00* | (2006.01) | |
| *H04M 1/02* | (2006.01) | |

(52) U.S. Cl.
CPC .......... *H02J 7/0042* (2013.01); *H02J 7/0047* (2013.01); *H02J 7/0063* (2013.01); *H05K 5/0086* (2013.01); *G06K 15/4055* (2013.01); *H04M 1/0262* (2013.01)

(58) Field of Classification Search
CPC .... H02J 7/0042; H02J 7/70047; H02J 7/0013; H02J 7/0063; H02J 7/0045; H04M 1/0262
USPC ........ 320/103, 107, 114, 115, 116, 132, 110; 429/99, 100, 101, 104
See application file for complete search history.

(56) References Cited

U.S. PATENT DOCUMENTS

| | | | |
|---|---|---|---|
| 5,183,716 A | 2/1993 | Nakacho et al. | |
| 2007/0054180 A1* | 3/2007 | Miyajima | ............ H01M 50/116 429/96 |
| 2013/0169038 A1* | 7/2013 | King | ................... H02J 7/00308 307/10.1 |

FOREIGN PATENT DOCUMENTS

| | | |
|---|---|---|
| JP | H02-223158 A | 9/1990 |
| JP | 2016-175374 A | 10/2016 |

* cited by examiner

*Primary Examiner* — Edward Tso
(74) *Attorney, Agent, or Firm* — Global IP Counselors, LLP

(57) ABSTRACT

A mobile device includes: a drive circuit driven based on power output from a battery; a first coupling portion configured to electrically couple a first battery being an electrolyte battery having a liquid electrolyte as the battery to the drive circuit; and a second coupling portion configured to electrically couple a second battery being an all-solid battery having a solid electrolyte as the battery to the drive circuit.

9 Claims, 10 Drawing Sheets

FIG. 11

| STATE SIGNAL | | | POWER SOURCE SELECTION SIGNAL | |
|---|---|---|---|---|
| S0 | S2a | S2b | SnH | SnL |
| 1 | 1 | 0 | 0 | 1 |
| 1 | 0 | 1 | 0 | 1 |
| 1 | 1 | 1 | 0 | 1 |
| 1 | 0 | 0 | 0 | 1 |
| 0 | 1 | 0 | 1 | 0 |
| 0 | 0 | 1 | 1 | 1 |
| 0 | 1 | 1 | 1 | 1 |
| 0 | 0 | 0 | 0 | 0 |

…

MOBILE DEVICE INCLUDING DRIVE CIRCUIT DRIVEN BY ELECTROLYTE BATTERY OR ALL-SOLID BATTERY

The present application is based on, and claims priority from JP Application Serial Number 2019-142081, filed Aug. 1, 2019, the disclosure of which is hereby incorporated by reference herein in its entirety.

BACKGROUND

1. Technical Field

The present disclosure relates to a mobile device.

2. Related Art

To date, small-sized and lightweight mobile devices that include a drive element and have portability are proposed. For example, as an example of the mobile devices, JP-A-2016-175374 discloses a portable liquid discharge apparatus mounted with a lithium ion battery having a liquid electrolyte as a battery. However, in recent years, all-solid batteries having a solid electrolyte are being developed as one of the batteries for use in such mobile devices. JP-A-2-223158 discloses an example of the all-solid batteries usable for the mobile device disclosed in JP-A-2016-175374, and the like.

The all-solid battery disclosed in JP-A-2-223158 has a solid electrolyte, and thus has a higher safety level compared with an electrolyte battery having a liquid electrolyte, such as a related-art lithium ion battery, and the like. Accordingly, the all-solid battery has a high degree of freedom in battery design and production processes. The all-solid battery having a solid electrolyte has therefore advantages in that most suitable shape and characteristics are obtained in accordance with its application for use. In contrast, an electrolyte battery having a liquid electrolyte and mounted on the mobile device disclosed in JP-A-2016-175374 is used for wide range of mobile devices, such as a smartphone, a tablet, a portable audio player, and the like in addition to the mobile printer disclosed in JP-A-2016-175374. Accordingly, an electrolyte battery having a liquid electrolyte has advantages in that it is highly versatile in terms of cost and delivery. In this manner, an all-solid battery having a solid electrolyte and an electrolyte battery having a liquid electrolyte have respective advantages that are different with each other. However, in a mobile device, such as the device disclosed in JP-A-2016-175374, it is only possible to mount either an all-solid battery or an electrolyte battery, and thus user convenience might be reduced. There is room for improvement in this respect.

SUMMARY

According to an aspect of the present disclosure, there is provided a mobile device including: a drive circuit driven based on power output from a battery; a first coupling portion configured to electrically couple a first battery being an electrolyte battery having a liquid electrolyte as the battery to the drive circuit; and a second coupling portion configured to electrically couple a second battery being an all-solid battery having a solid electrolyte as the battery to the drive circuit.

The mobile device described above may further include a first accommodation section configured to accommodate the first battery; and a second accommodation section configured to accommodate the second battery.

In the mobile device described above, when the first battery is accommodated in the first accommodation section, and the second battery is accommodated in the second accommodation section, at least one of the first battery and the second battery may not be electrically coupled to the drive circuit.

The mobile device described above may further include an information section configured to inform whether the battery electrically coupled to the drive circuit is the first battery or the second battery.

The mobile device described above may further include a control circuit configured to control driving of the drive circuit, in which when the drive circuit is driven based on power output from the first battery, the control circuit controls the drive circuit in a first drive state, and when the drive circuit is driven based on power output from the second battery, the control circuit controls the drive circuit in a second drive state different from the first drive state.

In the mobile device described above, the first coupling portion and the second coupling portion may not be electrically coupled.

The mobile device described above may further include a first detection circuit configured to detect a coupling of the first battery to the first coupling portion; a second detection circuit configured to detect a coupling of the second battery to the second coupling portion; and a selection circuit configured to select a battery to be used for driving the drive circuit based on a detection result of the first detection circuit and a detection result of the second detection circuit.

The mobile device described above may further include a third detection circuit configured to detect a coupling to an external power source, in which the selection circuit may select a battery to be used for driving the drive circuit based on the detection result of the first detection circuit, the detection result of the second detection circuit, and a detection result of the third detection circuit.

In the mobile device described above, when the first detection circuit detects a coupling of the first battery to the first coupling portion, and the second detection circuit detects a coupling of the second battery to the second coupling portion, the selection circuit may select the second battery as a battery to be used for driving the drive circuit.

BRIEF DESCRIPTION OF THE DRAWINGS

FIG. 11 is a diagram illustrating an example of a power source selection signal Sn output from a control circuit.

DESCRIPTION OF EXEMPLARY EMBODIMENTS

In the following, a description will be given of suitable embodiments according to the present disclosure with reference to the drawings. The drawings used are for the convenience sake of explanation. In this regard, the embodiments described below will not unreasonably limit the contents of the present disclosure disclosed in the scope of the appended claims. Also, all the components described in the following are not necessarily required for indispensable elements of the present disclosure.

1. First Embodiment

As a mobile device according to a first embodiment, a description will be given by taking an example of a mobile ink jet printer, which is a liquid discharge apparatus that forms an image onto a medium by discharging ink as a liquid and is configured to be driven by power supplied from a battery. In this regard, in the following description, a mobile ink jet printer is simply referred to as a mobile printer. Also, media onto which the mobile printer forms an image include, for example, plain paper used for printing an image, and the like, glossy paper used for printing photographs, and the like, and various kinds of recording paper including postcards.

1.1 Outer View of Mobile Printer

First, a description will be given of the outer configuration of a mobile device M with reference to FIGS. 1 to 3. In this regard, in the following description, an X-axis, a Y-axis, and a Z-axis that are perpendicular one another are used. Also, a starting point side on the X-axis is sometimes referred to as a "−X-direction", and the opposite side of the starting point side is sometimes referred to as a "+X-direction". Further, the "−X-direction" and the "+X-direction" are sometimes generically referred to as an "X-axis direction". In the same manner, a starting point side on the Y-axis is sometimes referred to as a "−Y-direction", and the opposite side of the starting point side is sometimes referred to as a "+Y-direction". Further, the "−Y-direction" and the "+Y-direction" are sometimes generically referred to as a "Y-axis direction". In the same manner, a starting point side on the Z-axis is sometimes referred to as a "−Z-direction", and the opposite side of the starting point side is sometimes referred to as a "+Z-direction". Further, the "−Z-direction" and the "+Z-direction" are sometimes generically referred to as a "Z-axis direction". Also, in the following description, a description will be given on the assumption that the X-axis, the Y-axis, and the Z-axis are perpendicular one another. However, this does not limit that individual units included in the mobile device M and a mobile printer 1 are perpendicular one another.

Figure 1:
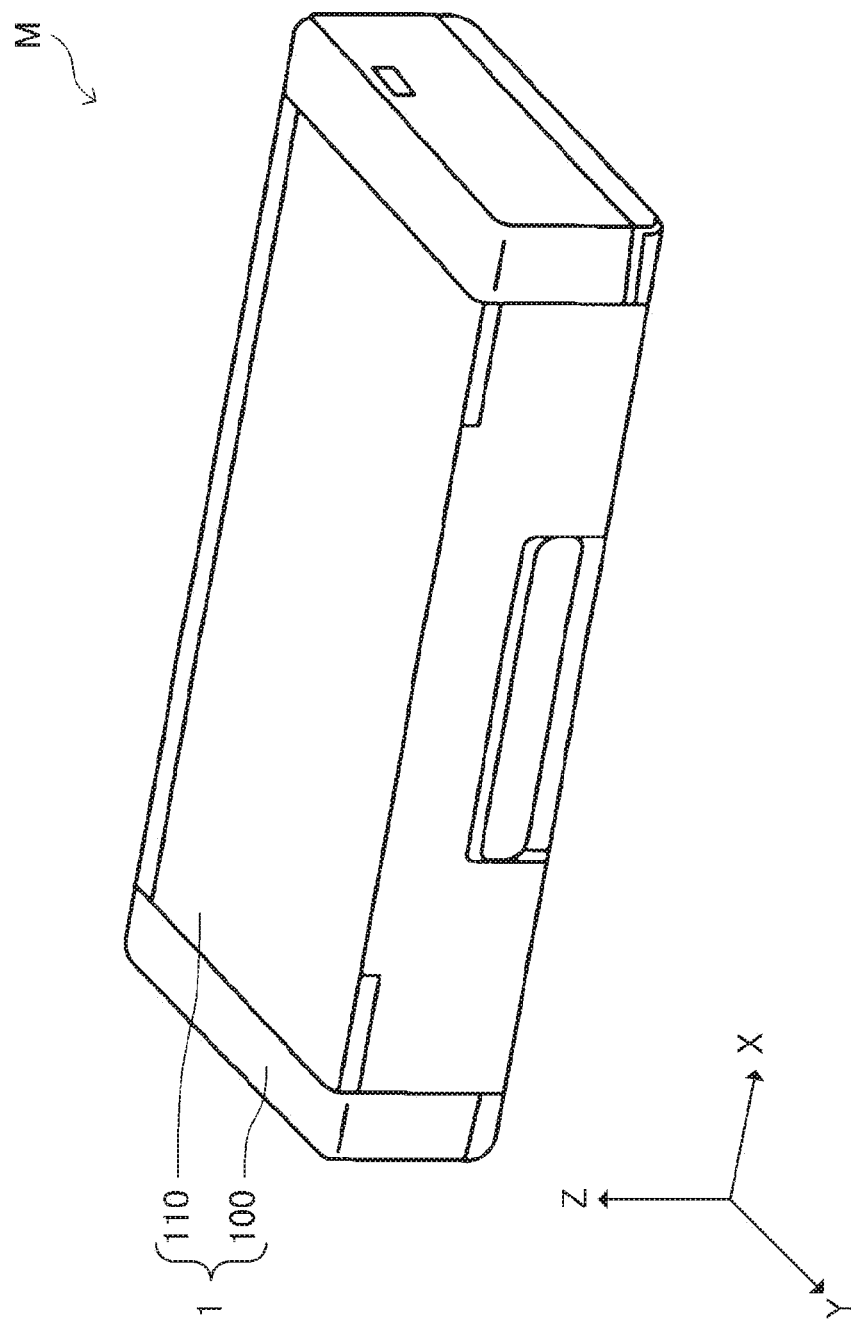
FIG. 1 is a view taken from +Y-direction of a mobile device.

FIG. 1 is a view taken from the +Y-direction of the mobile device M. FIG. 2 is a view taken from the +Y-direction of the mobile device M when a cover 110 is open. FIG. 3 is a view taken from the −Y-direction of the mobile device M.

As illustrated in FIG. 1, the mobile printer 1 as the mobile device M includes a casing 100 and the cover 110 disposed on the upper portion of the casing in an openable/closable manner.

Figure 2:
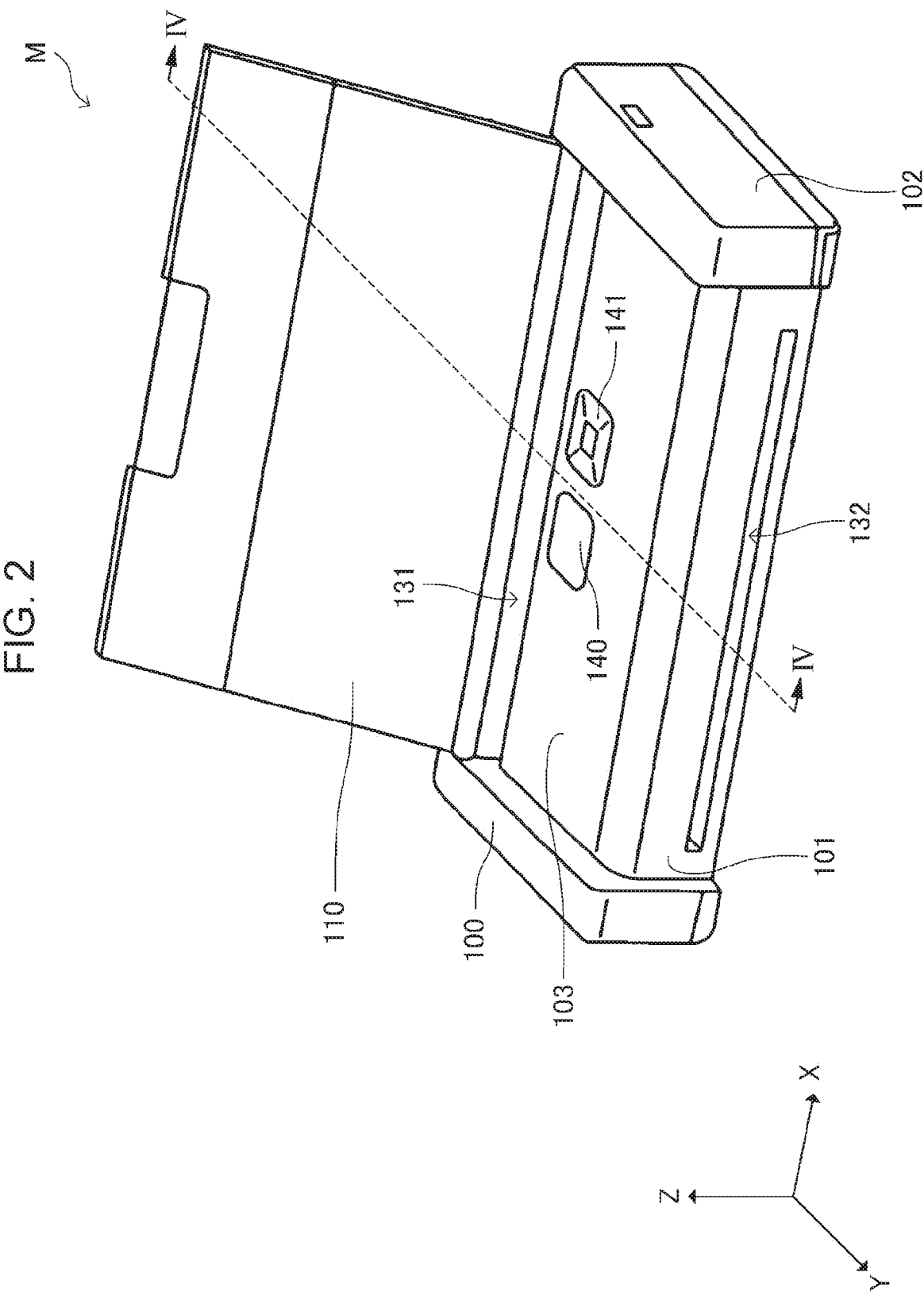
FIG. 2 is a view taken from +Y-direction of the mobile device when a cover is open.
Figure 3:
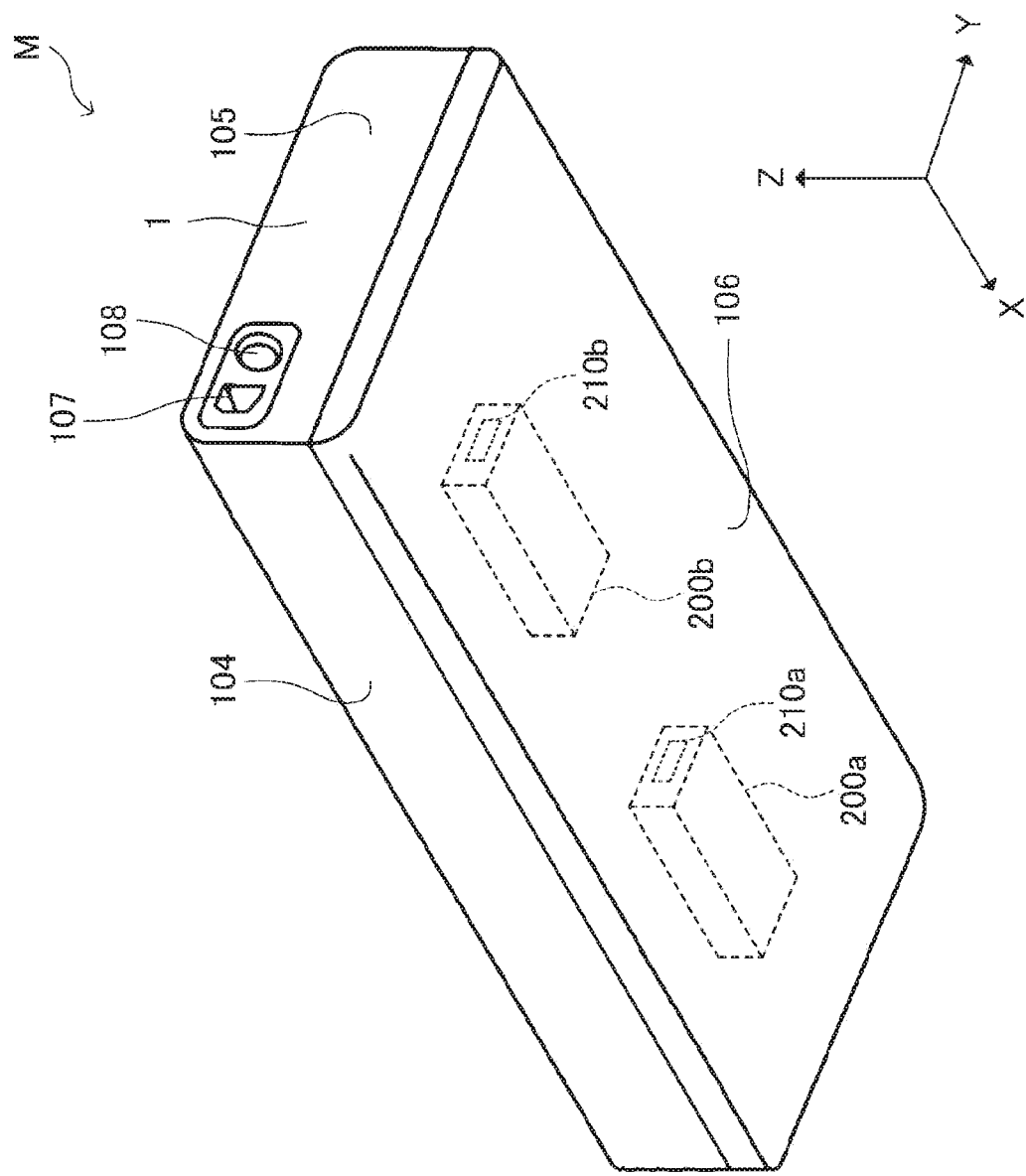
FIG. 3 is a view taken from −Y-direction of the mobile device.

As illustrated in FIG. 2 and FIG. 3, the casing 100 includes wall sections 101, 102, 103, 104, 105, and 106. The wall section 101 is positioned in the +Y-direction of the casing 100. The wall section 102 is positioned in the +X-direction of the casing 100. The wall section 103 is positioned in the +Z-direction of the casing 100. The wall section 104 is positioned in the −Y-direction of the casing 100. The wall section 105 is positioned in the −X-direction of the casing 100. The wall section 106 is positioned in the −Z-direction of the casing 100. That is to say, the wall section 101 and the wall section 104 are positioned in the Y-axis direction in a facing manner. The wall section 102 and the wall section 105 are positioned in the X-axis direction in a facing manner, and the wall section 103 and the wall section 106 are positioned in the Z-axis direction in a facing manner. That is to say, the casing 100 of the mobile printer 1 is substantially a cuboid having six faces that are surrounded by the wall sections 101 to 106 respectively and having space inside.

A display panel 140 and an operation switch 141 are disposed on the wall section 103 of the casing 100. The display panel 140 displays information based on the operation of the state of the mobile printer 1. In this regard, the display panel 140 may be constituted by a display panel, such as a liquid crystal panel, an electronic paper panel, an organic electroluminescence panel, or the like. The operation switch 141 receives operation by a user. Thereby, the mobile device M performs processing based on the operation of the operation switch 141. In this regard, the display panel 140 and the operation switch 141 may be configured as a touch panel in which the display panel 140 and the operation switch 141 are integrated.

A supply opening 131 for supplying a medium in the casing 100 is disposed on the wall section 103 in the −Y-direction. Also, a discharge opening 132 for discharging a medium supplied in the casing 100 is disposed on the wall section 101. A medium supplied in the casing 100 from the supply opening 131 is transported in the casing 100 and then is discharged from the discharge opening 132. Also, when the medium is transported in the casing 100, liquid is discharged onto the medium. The discharged liquid is attached on the medium, and then the medium is ejected from the discharge opening 132 so that an image based on the attached liquid is formed on the medium.

Also, as illustrated in FIG. 3, accommodation sections 200a and 200b that accommodate respective batteries 20 described later are disposed inside the casing 100. The accommodation section 200a is provided with a coupling portion 210a electrically coupled to the battery 20 accommodated in the accommodation section 200a, and the accommodation section 200b is provided with a coupling portion 210b electrically coupled to the battery 20 in the accommodation section 200b. When the battery 20 is accommodated in the accommodation section 200a, the battery 20 and the coupling portion 210a are electrically coupled, whereas when the battery 20 is accommodated in the accommodation section 200b, the battery 20 and the coupling portion 210b are electrically coupled. Thereby, the power output from the battery 20 is supplied to the mobile printer 1. That is to say, the mobile printer 1 is driven by the power supplied from the battery 20. Here, the mobile printer 1 according to the present embodiment is driven by either a first battery 20a, which is accommodated in the accommodation section 200a and is an electrolyte battery having a liquid electrolyte as the battery 20 or a second battery 20b, which is accommodated in the accommodation section 200b and is an all-solid battery having a solid electrolyte as the battery 20. Here, the accommodation section 200a is an example of the first accommodation section, and the accommodation section 200b is an example of the second accommodation section. The coupling portion 210a that electrically couples with the first battery 20a accommodated in the accommodation section 200a is an example of the first coupling portion, and the coupling portion 210b that electrically couples with the second battery 20b accommodated in the accommodation section 200b is an example of the second coupling portion.

Also, as illustrated in FIG. 3, the wall section 105 is provided with a DC jack 108 into which a DC (direct current) plug of an AC (alternating current) adapter not illustrated in the figure is pluggable and a USB (Universal Serial Bus) port 107 to which a USB cable is attachable. The mobile printer 1 is connected to an external device, such as a personal computer, a digital camera, or the like in a communicable manner via a USB cable electrically coupled to the USB port 107. Thereby, the mobile printer 1 is supplied with image information Img from the external devices. Also, the mobile printer 1 is supplied with a voltage Vd from an external power source via the DC jack 108. That is to say, it is possible for the mobile printer 1 to be operated by using the voltage Vd input from the DC jack 108 as a power source voltage.

1.2 Internal Configuration of Casing of Mobile Printer

Figure 4:
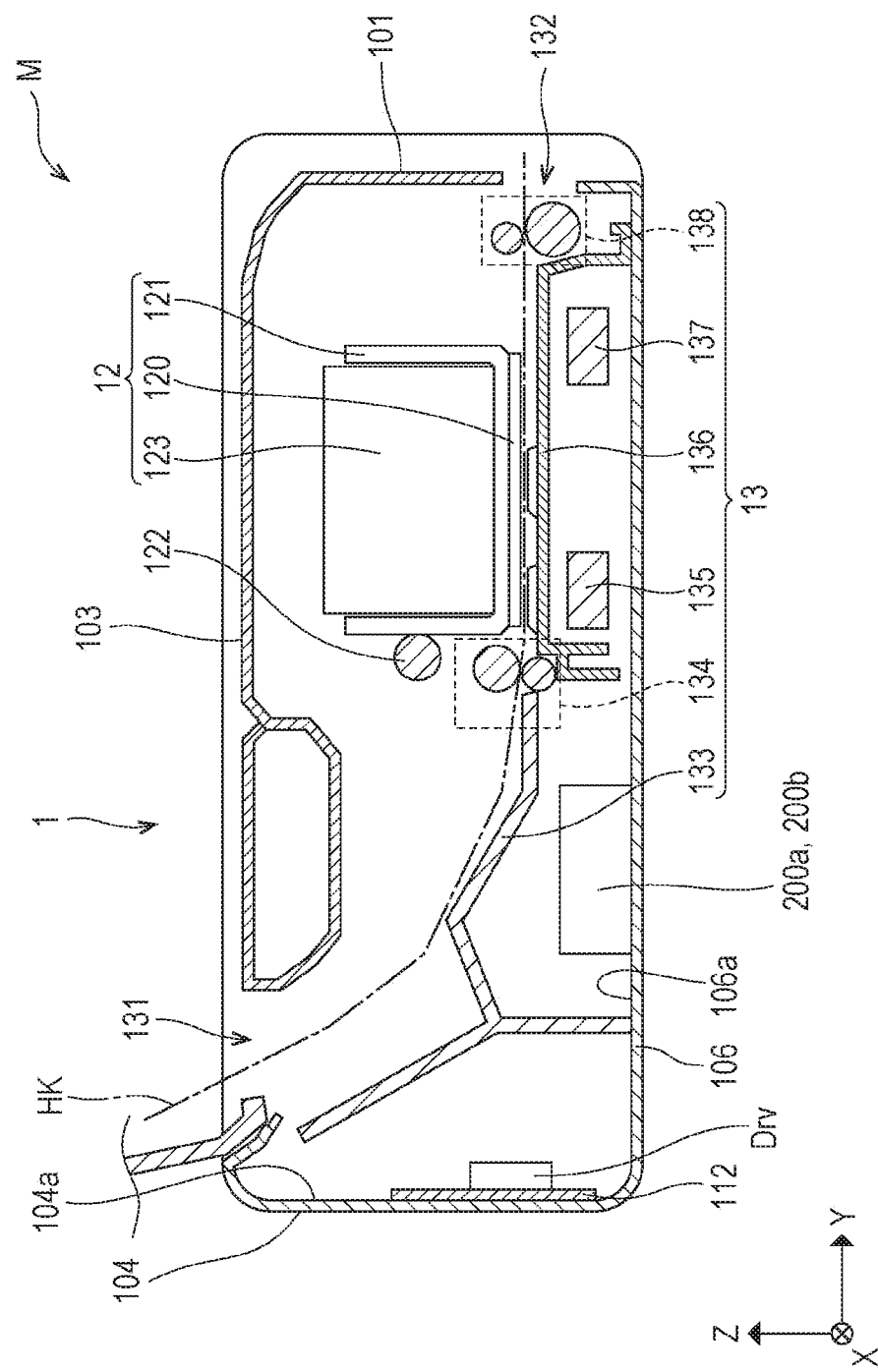
FIG. 4 is a cross-sectional view taken on line IV-IV of FIG. 2 of the mobile device.

Next, a description will be given of the internal configuration of the casing 100 of the mobile printer 1. FIG. 4 is a cross-sectional view taken on line IV-IV of FIG. 2 of the mobile device M.

As illustrated in FIG. 4, a head unit 12 and a transport unit 13 are disposed in the casing 100 of the mobile printer 1.

The head unit 12 includes a discharge head 120, a carriage 121, and a liquid container 123. The carriage 121 is supported in the −Y-direction by a carriage guide shaft 122 extending in the X-axis direction in a reciprocating manner. The carriage 121 is reciprocally moved in the X-axis direction in a state of being supported by the carriage guide shaft 122. The discharge head 120 is attached to the carriage 121 in the −Z-direction. Also, a liquid container 123 is mounted on the carriage 121 in the +Z-direction, which stores liquid to be discharged from the discharge head 120. The liquid container 123 and the discharge head 120 are physically coupled by a liquid path not illustrated in the figure. That is to say, the liquid stored in the liquid container 123 is supplied to the discharge head 120 via the liquid path not illustrated in the figure. The discharge head 120 discharges the supplied liquid.

The transport unit 13 includes a medium support section 133, a transport roller pair 134, a drive motor 135, a platen 136, a drive motor 137, and a transport roller pair 138. The medium support section 133 and the platen 136 form a transport path HK for transporting a medium supplied from the supply opening 131 to the discharge opening 132. The medium supplied to the supply opening 131 is transported from the medium support section 133 to the platen 136 with driving of the transport roller pair 134. The platen 136 is positioned in a facing manner to the discharge head 120 attached to the carriage 121 in the Z-axis direction. When the medium is supported by the platen 136, liquid is discharged from the discharge head 120 so that the liquid is impacted on the medium to form an image. After that, the medium is transported to the discharge opening 132 with driving of the transport roller pair 138.

Here, the transport roller pair 134 and the transport roller pair 138 for transporting the medium are controlled by driving of the drive motor 137. Also, the reciprocal movement of the carriage 121 is controlled by driving of the drive motor 135. That is to say, the drive motors 135 and 137 are controlled so that transporting of the medium and movement of the carriage 121 attached to the discharge head 120 are controlled. Thereby, it becomes possible to discharge a predetermined amount of liquid at a desired position of the medium to form a desired image on the medium.

A circuit substrate 112 on which a plurality of circuits including a drive unit Dry that outputs control signals for operating the head unit 12 and the transport unit 13 are implemented is disposed on the transport path HK in the −Y-direction. The circuit substrate 112 is attached to the inner surface 104a of the wall section 104 of the casing 100. In other words, at least a part of the drive unit Dry is in contact with the casing 100. Since the drive unit Dry outputs control signals for operating the head unit 12 and the transport unit 13, there is a high possibility that the drive unit Dry consumes higher power compared with the head unit 12 and the transport unit 13. As a result, the drive unit Dry is liable to generate higher heat than that generated by the head unit 12 and the transport unit 13. As illustrated in FIG. 4, by keeping at least a part of the drive unit Dry in contact with the casing 100, heat generated by the drive unit Dry is dissipated via the casing 100. As a result, it becomes possible to reduce a temperature increase of the drive unit Dry.

Also, the accommodation sections 200a and 200b are disposed in the X-axis direction on the inner surface 106a of the wall section 106 of the casing 100 in the −Z-direction of the transport path HK. In this regard, respective openable/closable lids not illustrated in the figure may be disposed for accommodating batteries 20 in the accommodation sections 200a and 200b on the corresponding contact portions of the accommodation sections 200a and 200b with the wall section 106.

1.3 Functional Configuration of Mobile Printer

Figure 5:
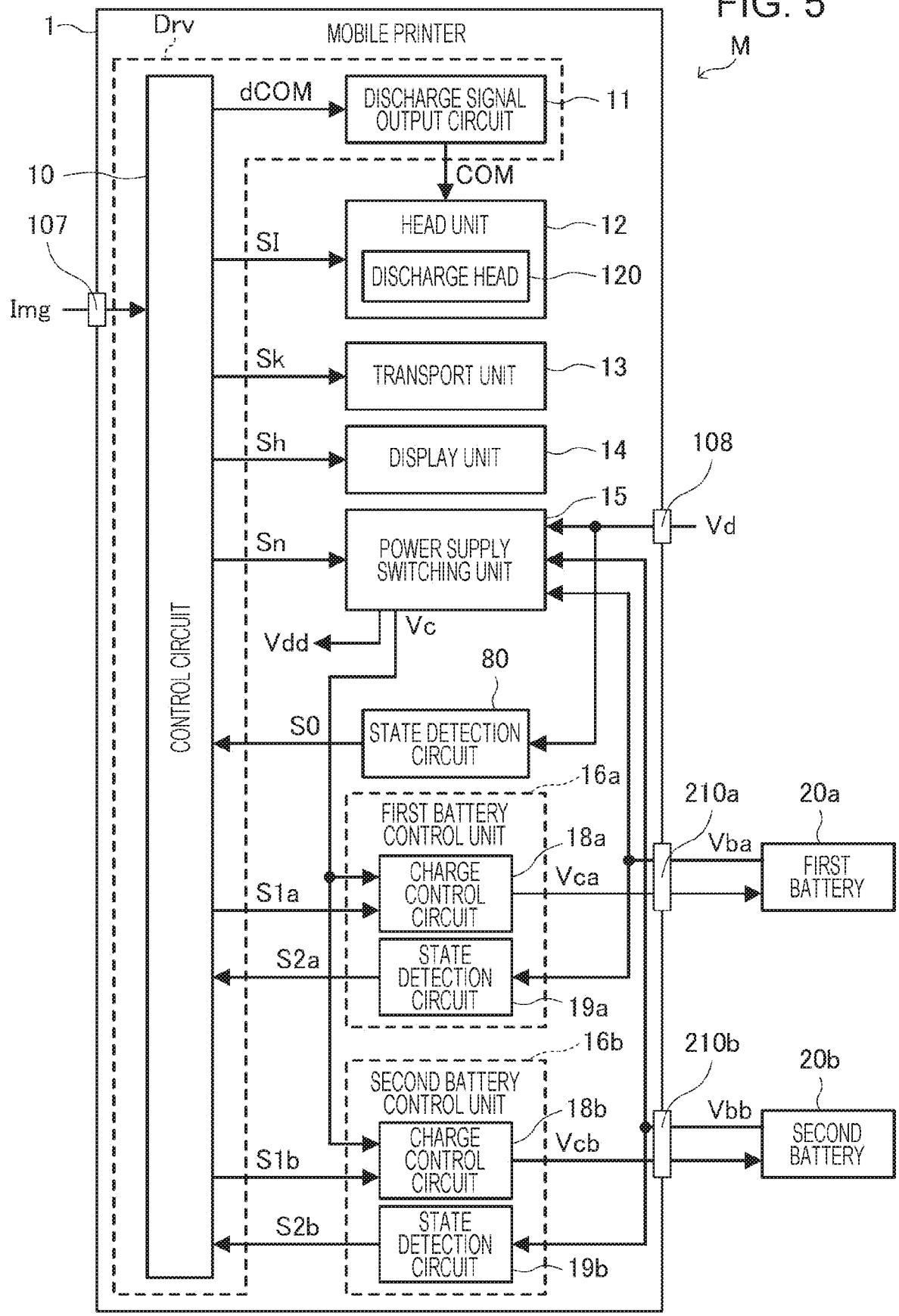
FIG. 5 is a diagram illustrating the functional configuration of the mobile device.

Here, a description will be given of the functional configuration of the mobile printer 1 with reference to FIG. 5. FIG. 5 is a diagram illustrating the functional configuration of the mobile device M.

The mobile printer 1 includes one or a plurality of control circuits 10, a discharge signal output circuit 11, a head unit 12, a transport unit 13, a display unit 14, a power supply switching unit 15, a first battery control unit 16a, and a second battery control unit 16b.

The control circuit 10 generates and outputs various control signals based on the image information Img input from the outside via the USB port 107 so as to control the operation of the mobile printer 1. The control circuit 10 includes, for example, a CPU (central processing unit). In this regard, instead of a CPU or in addition to a CPU, the control circuit 10 may include at least any one of a DSP (digital signal processor), an ASIC (application specific integrated circuit), a PLD (programmable logic device), and an FPGA (field programmable gate array).

The control circuit 10 generates a digital waveform regulation signal dCOM for specifying the waveform of a discharge signal COM from the discharge signal output circuit 11 and outputs the signal to the discharge signal output circuit 11. The discharge signal output circuit 11 converts the digital waveform regulation signal dCOM into an analog signal and then performs class D amplification on the converted analog signal to generate the discharge signal COM. That is to say, the waveform regulation signal dCOM is a digital signal that specifies the waveform of the discharge signal COM, and the discharge signal output circuit 11 performs class D amplification on the waveform specified by the waveform regulation signal dCOM to generate a discharge signal COM having a predetermined voltage value and outputs the signal to the head unit 12. In this regard, the waveform regulation signal dCOM ought to be a signal that specifies the waveform of the discharge signal COM, and may be an analog signal. Also, the discharge signal output circuit 11 ought to be able to amplify the waveform specified by the waveform regulation signal dCOM to a signal having a predetermined voltage value, and may include a class A amplifier circuit, a class B amplifier circuit, a class AB amplifier circuit, or the like.

Also, the control circuit 10 generates a discharge control signal SI for controlling discharge of liquid from a liquid discharge section not illustrated in the figure held by the discharge head 120 included in the head unit 12 and outputs the signal to the head unit 12. The liquid discharge section held by the discharge head 120 includes a nozzle and a drive element for discharging liquid from the nozzle. The drive element is driven by being supplied with the discharge signal COM. The amount of liquid in accordance with driving of the drive element is discharged from the nozzle. Also, the discharge head 120 controls the supply of the discharge signal COM to the drive element based on the input discharge control signal SI. Thereby, a predetermined amount of liquid is discharged at predetermined timing from the nozzle included in the liquid discharge section held by the discharge head 120.

Also, the control circuit 10 generates a transport control signal Sk for controlling the transport unit 13 and outputs the signal to the transport unit 13. The transport unit 13 transports the medium in a predetermined transport direction. By synchronizing the timing of transporting the medium by the transport unit 13 based on the transport control signal Sk and the timing of discharging liquid by the discharge head 120 based on the discharge control signal SI, a desired amount of liquid is discharged on a desired position of the medium. Accordingly, a desired image is formed on the medium.

Also, the control circuit 10 generates a display control signal Sh for controlling the display of various kinds of information on the display unit 14 and displays the information on the display unit 14. The display unit 14 displays various kinds of information, such as the operation information of the mobile device M, the state information, and the like in accordance with the display control signal Sh. Thereby, the user is informed of the information including the operation and the state of the mobile device M. The display unit 14 includes the display panel 140 described above, the operation switch 141, a touch panel in which the display panel 140 and the operation switch 141 are integrated, and the like.

Also, the control circuit 10 generates a power source selection signal Sn for controlling switching of the supply source of the power source voltage that drives the mobile printer 1 and outputs the signal to the power supply switching unit 15. The power supply switching unit 15 receives input of a voltage Vba supplied from the first battery 20a via the coupling portion 210a, a voltage Vbb supplied from the second battery 20b via the coupling portion 210b, and a voltage Vd supplied from the AC adapter disposed outside the mobile device M via the DC jack 108. The power supply switching unit 15 selects any one of the voltages Vba, Vbb, and Vd based on the power source selection signal Sn, and supplies the voltage to each section of the mobile printer 1 as a voltage Vdd, which is the power source voltage that drives the mobile printer 1. Also, the power supply switching unit 15 generates a voltage Vc for charging the first battery 20a and the second battery 20b based on the voltage Vd supplied from the AC adapter and outputs the voltage to the first battery control unit 16a and the second battery control unit 16b. In this regard, the first battery 20a and the second battery 20b are illustrated to be disposed outside the mobile printer 1 in FIG. 5. However, in reality, the batteries 20 are disposed in the accommodation sections 200 in the mobile printer 1 in a detachable manner.

Figure 6:
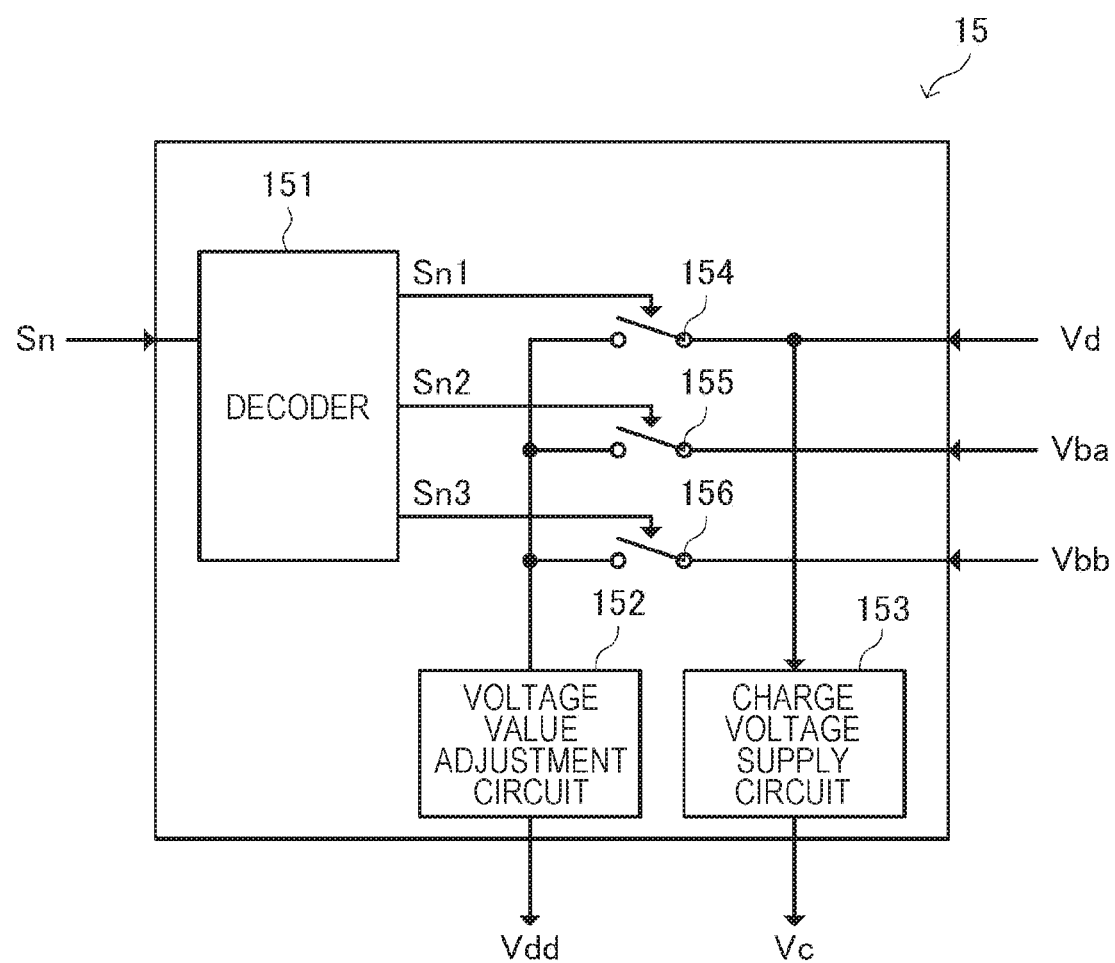
FIG. 6 is a diagram illustrating an example of a power supply switching unit.

Here, a description will be given of an example of the configuration of the power supply switching unit 15 with reference to FIG. 6. FIG. 6 is a diagram illustrating an example of a power supply switching unit 15. The power supply switching unit 15 includes a decoder 151, a voltage value adjustment circuit 152, a charge voltage supply circuit 153, and switches 154, 155, and 156.

The decoder 151 receives input of the power source selection signal Sn. The decoder 151 outputs selection signals Sn1, Sn2, and Sn3 based on the input power source selection signal Sn. For example, the power source selection signal Sn includes two-bit selection data [SnH, SnL]. When the selection data [SnH, SnL] is [0, 0], the decoder 151 sets the logical level of the selection signals Sn1, Sn2, and Sn3 to L level, L level, and L level respectively. Also, when the logical level of the selection data [SnH, SnL] is [0, 1], the decoder 151 sets the selection signals Sn1, Sn2, and Sn3 to H level, L level, and L level. Also, when the selection data [SnH, SnL] is [1, 0], the decoder 151 sets the logical level of the selection signals Sn1, Sn2, and Sn3 to L level, H level, and L level respectively. Also, when the selection data [SnH, SnL] is [1, 1], the decoder 151 sets the logical level of the selection signals Sn1, Sn2, and Sn3 to L level, L level, and H level respectively.

The selection signals Sn1, Sn2, Sn3 are input to the corresponding control terminals of the switches 154, 155, and 156. The input end of the switch 154 receives input of the voltage Vd. The input end of the switch 155 receives input of the voltage Vba. The input end of the switch 156 receives input of the voltage Vbb. Also, the respective output ends of the switches 154, 155, and 156 are commonly coupled, and then electrically coupled to the voltage value adjustment circuit 152. When the logical level of the signal input to the respective control terminals of the switches 154, 155, and 156 is H level, the input end and the output end become conductive. When, the logical level of the signal input to the respective control terminals is L level, the input end and the output end become non-conductive.

The voltage value adjustment circuit 152 increases or decreases the input voltage so as to generate the voltage Vdd having a predetermined voltage value and outputs the voltage.

Specifically, when the two-bit selection data [SnH, SnL] included in the power source selection signal Sn input to the power supply switching unit 15 is [0, 0], all the switches 154, 155, and 156 are controlled to be non-conductive. Accordingly, a voltage is not input to the voltage value adjustment circuit 152, and as a result, the voltage Vdd is not output. Also, when the two-bit selection data [SnH, SnL] included in the input power source selection signal Sn is [0, 1], the switch 154 is controlled to be conductive, and the switches 155 and 156 are controlled to be both non-conductive. Accordingly, the voltage Vd is input to the voltage value adjustment circuit 152. As a result, the voltage value adjustment circuit 152 outputs the voltage Vdd based on the voltage Vd. Also, when the two-bit selection data [SnH, SnL] included in the input power source selection signal Sn is [1, 0], the switch 155 is controlled to be conductive, but the switches 154 and 156 are controlled to be both non-conductive. Accordingly, the voltage Vba is input to the voltage value adjustment circuit 152. As a result, the voltage value adjustment circuit 152 outputs the voltage Vdd based on the voltage Vba. Also, when the two-bit selection data

[SnH, SnL] included in the input power source selection signal Sn is [1, 1], the switch 156 is controlled to be conductive, and the switches 154 and 155 are controlled to be both non-conductive. Accordingly, the voltage Vbb is input to the voltage value adjustment circuit 152. As a result, the voltage value adjustment circuit 152 outputs the voltage Vdd based on the voltage Vbb.

As described above, the power supply switching unit 15 electrically couples any one of the first battery 20a that outputs the voltage Vba, the second battery 20b that outputs the voltage Vbb, and the AC adapter that outputs the voltage Vd to each section of the mobile printer 1 including the head unit 12, the transport unit 13, and the display unit 14 based on the power source selection signal Sn. In other words, when the first battery 20a is accommodated in the accommodation section 200a, and the second battery 20b is accommodated in the accommodation section 200b, at least one of the first battery 20a and the second battery 20b is not electrically coupled to each section of the mobile printer 1 including the head unit 12, the transport unit 13, and the display unit 14. Further, the coupling portion 210a that electrically couples to the first battery 20a and the coupling portion 210b that electrically couples to the second battery 20b are not electrically coupled.

As described above, the coupling portion 210a that is electrically coupled to the first battery 20a and the coupling portion 210b that is electrically coupled to the second battery 20b are not electrically coupled, and at least one of the first battery 20a and the second battery 20b is not electrically coupled to each section of the mobile printer 1 including the head unit 12, the transport unit 13, and the display unit 14. Accordingly, the risk of causing malfunction of the mobile printer 1, which might be caused by an unintended signal voltage value supplied to the mobile printer 1 from a battery not used for driving the mobile printer 1, is reduced.

Also, the power supply switching unit 15 includes the charge voltage supply circuit 153 that generates the voltage Vc. The charge voltage supply circuit 153 receives input of the voltage Vd. The charge voltage supply circuit 153 generates and outputs the voltage Vc having a fixed current value or the voltage Vc having a fixed voltage value for charging the first battery 20a and the second battery 20b based on the voltage Vd.

Referring back to FIG. 5, the mobile printer 1 includes a state detection circuit 80 that detects the state of an external power source electrically coupled to the DC jack 108 and generates a state signal S0 indicating a detection result and outputs the signal to the control circuit 10.

Specifically, the state detection circuit 80 detects the voltage value of the voltage Vd output from the external power source electrically coupled via the DC jack 108. Thereby, the state detection circuit 80 detects a coupling of the external power source and the DC jack 108. The state detection circuit 80 generates the state signal S0 indicating the state of the external power source in accordance with a detection result and outputs the signal to the control circuit 10. As an example, when the mobile printer 1 is electrically coupled to an external power source via the DC jack 108, the state detection circuit 80 outputs "1" to the control circuit 10 as the state signal S0, whereas when the via mobile printer 1 is not electrically coupled to the external power source via the DC jack 108, the state detection circuit 80 outputs "0" to the control circuit 10 as the state signal S0. the control circuit 10 generates the power source selection signal Sn based on the input state signal S0 and outputs the signal to the power supply switching unit 15. Thereby, it becomes possible for the power supply switching unit 15 to select the voltage Vd output from the external power source. The power supply switching unit 15 selects the voltage Vd supplied from the external power source based on the power source selection signal Sn and supplies the voltage to each section of the mobile printer 1 as the voltage Vdd so that the mobile printer 1 is driven by the power in accordance with the voltage Vd supplied the external power source via the DC jack 108.

The control circuit 10 generates a control signal S1a for controlling the first battery control unit 16a and outputs the signal to the first battery control unit 16a. Also, the control circuit 10 receives input of a state signal S2a from the first battery control unit 16a. The first battery control unit 16a includes a charge control circuit 18a for controlling charging of the first battery 20a and a state detection circuit 19a that detects the state of the first battery 20a and generates and outputs the state signal S2a indicating a detection result.

Specifically, the state detection circuit 19a detects, for example, the voltage value of the voltage Vba from the first battery 20a as the state of the first battery 20a. Thereby, the state detection circuit 19a detects that the first battery 20a is electrically coupled to the coupling portion 210a. The state detection circuit 19a generates the state signal S2a indicating the state of the first battery 20a in accordance with a detection result and outputs the signal to the control circuit 10. For example, when the first battery 20a is electrically coupled to the coupling portion 210a, the state detection circuit 19a outputs "1" to the control circuit 10 as the state signal S2a, whereas when the first battery 20a is not electrically coupled to the coupling portion 210a, the state detection circuit 19a outputs "0" to the control circuit 10 as the state signal S2a. The control circuit 10 generates the power source selection signal Sn based on the input state signal S2a and outputs the signal to the power supply switching unit 15. Thereby, it becomes possible for the power supply switching unit 15 to select the voltage Vba output from the first battery 20a. The power supply switching unit 15 selects the voltage Vba supplied from the first battery 20a based on the power source selection signal Sn and supplies the voltage as the voltage Vdd to each section of the mobile printer 1 so that the mobile printer 1 is driven by power in accordance with the voltage Vba supplied from the first battery 20a.

Also, the state detection circuit 19a detects, for example, the voltage value of the voltage Vba output from the first battery 20a and the temperature of the first battery 20a as the state of the first battery 20a, generates the state signal S2a indicating the state of the first battery 20a in accordance with a detection result, and outputs the signal to the control circuit 10. The control circuit 10 determines whether or not to charge the first battery 20a from the detected voltage value of the voltage Vba and the temperature of the first battery 20a, generates the control signal S1a indicating a determination result, and outputs the signal to the charge control circuit 18a. The charge control circuit 18a changes whether or not to output the voltage Vc input from the power supply switching unit 15 as the voltage Vca for charging the first battery 20a based on the control signal S1a.

Also, the control circuit 10 generates a control signal Sib for controlling the second battery control unit 16b and outputs the signal to the second battery control unit 16b. Also, the control circuit 10 receives input of a state signal S2b from the second battery control unit 16b. The second battery control unit 16b includes a charge control circuit 18b for controlling charging of the second battery 20b, and a state detection circuit 19b for detecting the state of the second battery 20b, generating the signal S2b indicating a detection result, and outputting the signal.

Specifically, the state detection circuit 19b detects, for example, the voltage value of the voltage Vbb output from the second battery 20b as the state of the second battery 20b. Thereby, the state detection circuit 19b detects that the second battery 20b is electrically coupled to the coupling portion 210b. The state detection circuit 19b generates the state signal S2b indicating the state of the second battery 20b in accordance with a detection result and outputs the signal to the control circuit 10. For example, when the second battery 20b is electrically coupled to the coupling portion 210b, the state detection circuit 19b outputs "1" to the control circuit 10 as the state signal S2b, whereas when the second battery 20b is not electrically coupled to the coupling portion 210b, the state detection circuit 19b outputs "0" to the control circuit 10 as the state signal S2b. The control circuit 10 generates the power source selection signal Sn based on the input state signal S2b and outputs the signal to the power supply switching unit 15. Thereby, it becomes possible for the power supply switching unit 15 to select the voltage Vbb output from the second battery 20b. The power supply switching unit 15 selects the voltage Vbb supplied from the second battery 20b based on the power source selection signal Sn and supplies the voltage to each section of the mobile printer 1 as the voltage Vdd so that the mobile printer 1 is driven by the power in accordance with the voltage Vbb supplied from the second battery 20b.

Also, the state detection circuit 19b detects, for example, the voltage value of the voltage Vbb output from the second battery 20b and the temperature of the second battery 20b as the state of the second battery 20b, generates the state signal S2b indicating the state of the second battery 20b in accordance with a detection result, and outputs the signal to the control circuit 10. The control circuit 10 determines whether or not to charge the second battery 20b from the voltage value of the detected voltage Vbb and the temperature of the second battery 20b, generates the control signal Sib indicating a determination result, and outputs the signal to the charge control circuit 18b. The charge control circuit 18b changes whether or not to output the voltage Vc input from the power supply switching unit 15 as the voltage Vcb for charging the second battery 20b based on the control signal Sib.

NOW Also, the control circuit 10 may obtain the information on the first battery 20a and the second battery 20b that are accommodated in the accommodation sections 200a and 200b based on the state signal S2a output from the state detection circuit 19a and the state signal S2b output from the state detection circuit 19b, respectively, and may display the obtained information on the display unit 14. Further, the control circuit 10 may display on the display unit 14 whether the power supplied to each section of the mobile printer 1 is the power in accordance with the voltage Vba output from the first battery 20a or the power in accordance with the voltage Vbb output from the second battery 20b based on the power source selection signal Sn. In other words, the display unit 14 informs a user of whether the battery electrically coupled to the mobile printer 1 including the head unit 12, the transport unit 13, and the like is the first battery 20a or the second battery 20b. The display unit 14 is an example of the information section.

Here, in the mobile printer 1 that is operated based on the power in accordance with the voltage output from the battery 20, the head unit 12 driven by the discharge signal COM and the discharge control signal SI is an example of the drive circuit, the transport unit 13 driven based on the transport control signal Sk and the display unit 14 driven based on the display control signal Sh are examples of the other drive circuit. The control circuit 10 that outputs the control signals for controlling the head unit 12, the transport unit 13, and the display unit 14 so as to control driving of the head unit 12, the transport unit 13, and the display unit 14 is an example of the control circuit.

Also, the control circuit 10 may individually change the operation states of the head unit 12, the transport unit 13, and the display unit 14 in accordance with the case where the voltage Vdd for driving the mobile printer 1 that is selected by the power supply switching unit 15 is generated based on the voltage Vd output by the external power source, the voltage Vba output by the first battery 20a, or the voltage Vbb output by the second battery 20b. In other words, the control circuit 10 may perform control such that the operation state of the mobile printer 1 differs in the case where the mobile printer 1 is driven based on the voltage Vd output from the external power source, the case where the mobile printer 1 is driven based on the voltage Vba output from the first battery 20a, and the case where the mobile printer 1 is driven based on the voltage Vbb output from the second battery 20b.

As described above, the control circuit 10 has not only a function of controlling driving of the mobile printer 1 but also a function of selecting the power source for use for driving the mobile printer 1 from any one of the first battery 20a, the second battery 20b, and the external power source. That is to say, the control circuit 10 is an example of the selection circuit that selects the power source for driving each section of the mobile printer 1 from any one of the first battery 20a, the second battery 20b, and the external power source. In this regard, a circuit other than the control circuit 10 may select any one of the first battery 20a, the second battery 20b, and the external power source.

FIG. 11 is a diagram illustrating an example of the power source selection signal Sn output from the control circuit 10. As illustrated in FIG. 11, the control circuit 10 generates the selection data [SnH, SnL] illustrated in FIG. 11 as the power source selection signal Sn in accordance with the input state signal S0, state signal S2a, and state signal S2b, and output the signal to the power supply switching unit 15.

When the state signal S0 is "1", that is to say, when the mobile printer 1 is electrically coupled to the external power source, the control circuit 10 generates the power source selection signal Sn having the selection data [SnH, SnL] of [0, 1] regardless of the vales of the state signals S2a and S2b, and outputs the signal to the power supply switching unit 15. Accordingly, among the switches 154, 155, and 156, only the switch 154 becomes a conductive state. As a result, the voltage value adjustment circuit 152 outputs the voltage Vdd based on the voltage Vd. When the mobile printer 1 is electrically coupled to an external power source, in the case where at least one of the first battery 20a and the second battery 20b is electrically coupled to a corresponding one of the coupling portions 210a and 210b, operation is performed by the power in accordance with the voltage supplied from the external power source so that the power supplied to the mobile printer 1 becomes stable. As a result, the mobile printer 1 is operated stably. Further, the mobile printer 1 is operated by the power in accordance with the voltage supplied from the external power source, and thus the risk of consuming the electric charge stored in the first battery 20a and the second battery 20b is reduced. Accordingly, the voltage Vd of the external power source is used as the voltage Vdd for driving the mobile printer 1.

When the state signal S0 is "0", the state signal S2a is "1", and the state signal S2b is "0", that is to say, when the mobile printer 1 is electrically coupled only to the first battery 20a, which is an electrolyte battery, the control circuit 10 generates the power source selection signal Sn having the selection data [SnH, SnL] of [1, 0], and outputs the signal to the power supply switching unit 15. Accordingly, among the switches 154, 155, and 156, only the switch 155 becomes a conductive state. As a result, the voltage value adjustment circuit 152 outputs the voltage Vdd based on the voltage Vba. This is because only the voltage Vba of the first battery 20a is possible to be used for the voltage Vdd for driving the mobile printer 1.

When the state signal S0 is "0", the state signal S2a is "0", and the state signal S2b is "1", that is to say, when the mobile printer 1 is electrically coupled only to the second battery 20b, which is an all-solid battery, the control circuit 10 generates the power source selection signal Sn having the selection data [SnH, SnL] of [1, 1], and outputs the signal to the power supply switching unit 15. Accordingly, among the switches 154, 155, and 156, only the switch 156 becomes a conductive state. As a result, the voltage value adjustment circuit 152 outputs the voltage Vdd based on the voltage Vbb. This is because only the voltage Vbb of the second battery 20b is possible to be used for the voltage Vdd for driving the mobile printer 1.

When the state signal S0 is "0", the state signal S2a is "1", and the state signal S2b is "1", that is to say, when the mobile printer 1 is not electrically coupled to the external power source, but is electrically coupled to the two batteries, namely the first battery 20a, which is an electrolyte battery, and the second battery 20b, which is an all-solid battery, the control circuit 10 generates the power source selection signal Sn having the selection data [SnH, SnL] of [1, 1], and outputs the signal to the power supply switching unit 15. Accordingly, among the switches 154, 155, and 156, only the switch 156 becomes a conductive state. As a result, the voltage value adjustment circuit 152 outputs the voltage Vdd based on the voltage Vbb. When comparing deterioration of an electrolyte battery with that of an all-solid battery, an all-solid battery is more unlikely to deteriorate. Accordingly, the voltage Vbb supplied from the second battery 20b is used more preferentially than the voltage Vba supplied from the first battery 20a for the voltage Vdd for driving the mobile printer 1.

When the state signal S0 is "0", the state signal S2a is "0", and the state signal S2b is "0", that is to say, when the mobile printer 1 is electrically coupled to none of the external power source, the first battery 20a, and the second battery 20b, the control circuit 10 generates the power source selection signal Sn having the selection data [SnH, SnL] of [0, 0], and outputs the signal to the power supply switching unit 15. Accordingly, all of the switches 154, 155, and 156 become non-conductive states, and the voltage value adjustment circuit 152 does not output the voltage Vdd.

As described above, the control circuit 10 selects the power supplied to each section of the mobile printer 1 from any one of the first battery 20a, the second battery 20b, and the external power source based on the detection result of the state detection circuit 19a detecting that the coupling portion 210a is electrically coupled to the first battery 20a, the detection result of the state detection circuit 19b detecting that the coupling portion 210b is electrically coupled to the second battery 20b, and the detection result of the state detection circuit 80 detecting that the mobile device M is electrically coupled to the external power source. Here, the state detection circuit 19a is an example of the first detection circuit, the state detection circuit 19b is an example of the second detection circuit, the state detection circuit 80 is an example of the third detection circuit, and the control circuit 10 that selects the power supplied to each section of the mobile printer 1 from any one of the first battery 20a, the second battery 20b, and the external power source is an example of the selection circuit.

Here, as described above, the first battery 20a is an electrolyte battery having a liquid electrolyte, and the second battery 20b is an all-solid battery having a solid electrolyte, and thus the first battery 20a and the second battery 20b sometimes have different charge/discharge characteristics. Since the first battery 20a and the second battery 20b have different charge/discharge characteristics, the consumption amount of electric charge of the first battery 20a when power for driving the mobile printer 1 is supplied in accordance with the voltage Vba output by the first battery 20a differs from the consumption amount of electric charge of the second battery 20b when power for driving the mobile printer 1 in accordance with the voltage Vbb output from the second battery 20b.

When the same operation of the mobile printer 1 is performed as that for a battery having a small consumption amount of electric charge out of the first battery 20a and the second battery 20b using a battery having a large consumption amount of electric charge out of the first battery 20a and the second battery 20b, the mobile printer 1 that is driven by a battery having a large consumption amount of electric charge needs to have a high charge frequency of the battery. Accordingly, the convenience of the portable mobile device M might be lost.

Thus, when power for driving the mobile printer 1 is supplied from a battery having a large consumption amount of electric charge out of the first battery 20a and the second battery 20b, by limiting the discharge speed of liquid from the head unit 12, by limiting the transport speed of the medium by the transport unit 13, and by limiting the movement speed of the carriage 121, the power consumption of the mobile printer 1 is reduced. As a result, the consumption amount of electric charge stored in the battery is reduced. Thereby, the charge frequency of the battery is reduced, and thus the risk of losing the convenience of the portable mobile device M is reduced.

Here, the individual operation states of the mobile printer 1, the head unit 12, the transport unit 13, and the display unit 14 when the power for driving the mobile printer 1 is supplied by the voltage Vba output by the first battery 20a are examples of the first drive state. The individual operation states of the mobile printer 1, the head unit 12, the transport unit 13, and the display unit 14 when the power for driving the mobile printer 1 is supplied with the voltage Vbb output by the second battery 20b are examples of the second drive state.

For example, an electrolyte battery tends to discharge more than an all-solid battery, and thus the consumption amount of electric charge might be larger. In this case, compared with the second drive state in which operation is performed by the second battery 20b, it becomes possible to reduce the power consumption in the first drive state in which operation is performed by the first battery 20a. Thereby, it is possible to keep the convenience in the case of using the first battery 20a, which is an electrolyte battery. Specifically, in the first drive state, by decreasing the movement speed of the head unit 12 than that in the second drive state or by reducing the light emission amount of the display unit 14, it is possible to reduce the drive power.

1.4 Advantages

The mobile printer 1 as the mobile device M configured as described above includes the coupling portion 210a electrically coupling to the first battery 20a, which is an electrolyte battery having a liquid electrolyte as a battery 20, and the coupling portion 210b electrically coupling to the second battery 20b, which is an all-solid battery having a solid electrolyte as the battery 20. Based on the power in accordance with the voltage output from the selected battery 20, the head unit 12, the transport unit 13, and the display unit 14 included in the mobile printer 1 are individually driven. Accordingly, it becomes possible for one mobile device M to select and use the two kinds of batteries, namely the second battery 20b, which is an all-solid battery and the first battery 20a, which is an electrolyte battery, and thus it is possible to improve the convenience of the user.

2. Second Embodiment

A description will be given of a smartphone, which is a display device configured to display various kinds of information and is operated by a battery as an example of a mobile device according to a second embodiment. In this regard, in the description of the mobile device according to the second embodiment, the same sign is given to the same component as that described above, and the description will be omitted or simplified.

Figure 7:
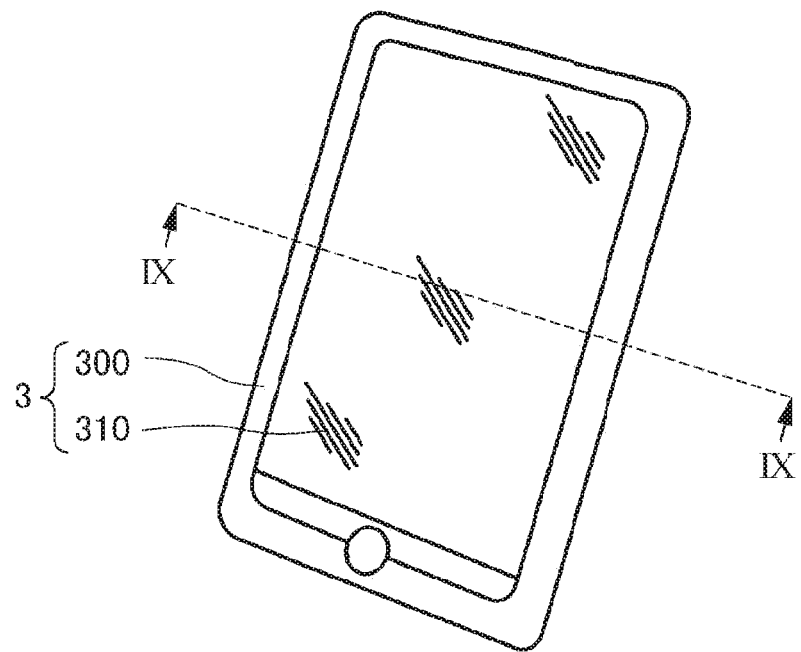
FIG. 7 is a view taken from a front side of a mobile device according to a second embodiment.
Figure 8:
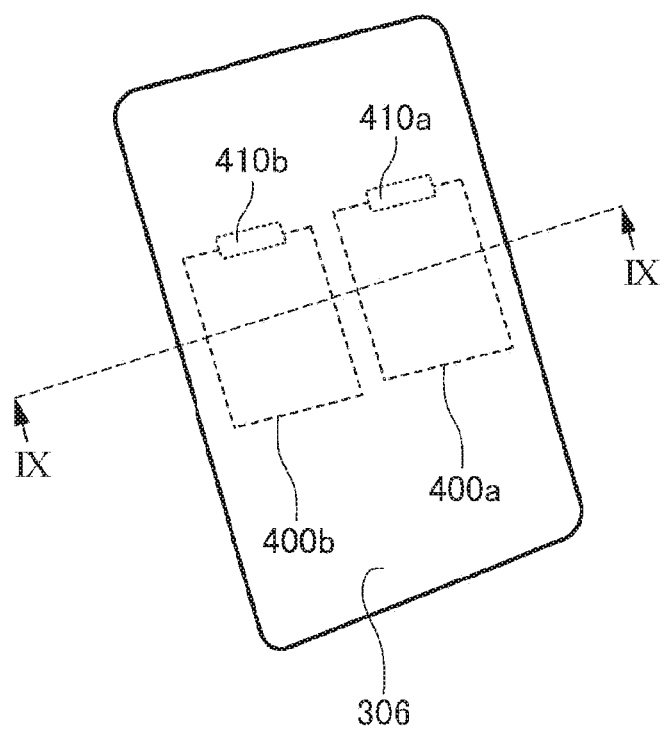
FIG. 8 is a view taken from a back side of the mobile device according to the second embodiment.
Figure 9:
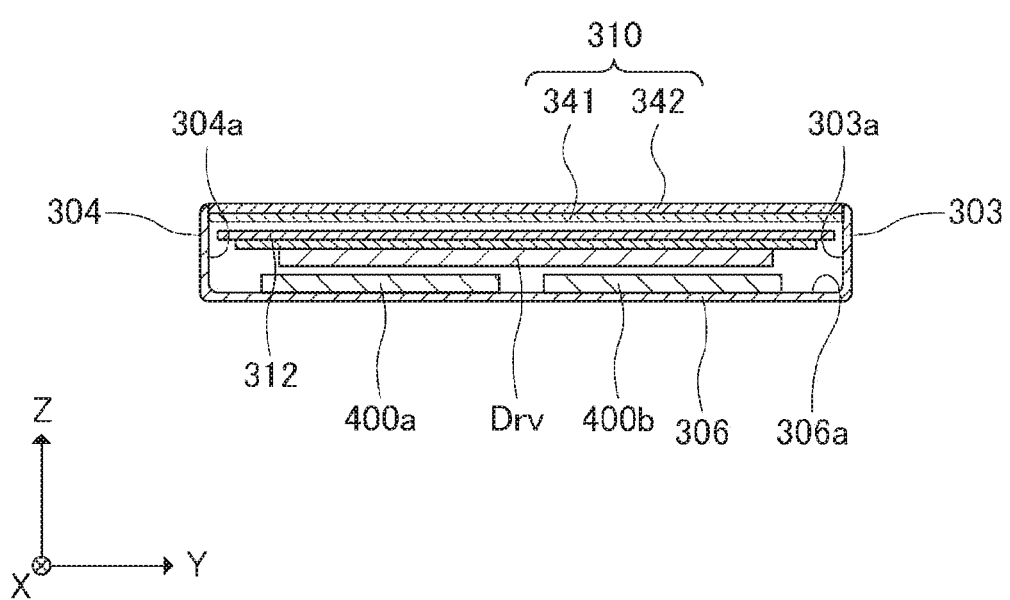
FIG. 9 is a cross-sectional view taken on line IX-IX of FIG. 7 of the mobile device according to the second embodiment.

FIGS. 7 to 9 are diagrams for explaining the configuration of a smartphone 3 as the mobile device M. In this regard, in the following description, an X-axis, a Y-axis, and a Z-axis that are perpendicular one another are used. Also, a starting point side on the X-axis is sometimes referred to as a "−X-direction", and the opposite side of the starting point side is sometimes referred to as a "+X-direction". Further, the "−X-direction" and the "+X-direction" are sometimes generically referred to as an "X-axis direction". In the same manner, a starting point side on the Y-axis is sometimes referred to as a "−Y-direction", and the opposite side of the starting point side is sometimes referred to as a "+Y-direction". Further, the "−Y-direction" and the "+Y-direction" are sometimes generically referred to as a "Y-axis direction". In the same manner, a starting point side on the Z-axis is sometimes referred to as a "−Z-direction", and the opposite side of the starting point side is sometimes referred to as a "+Z-direction". Further, the "−Z-direction" and the "+Z-direction" are sometimes generically referred to as a "Z-axis direction". Also, in the following description, a description will be given on the assumption that the X-axis, the Y-axis, and the Z-axis are perpendicular one another. However, this does not limit that individual units included in the smartphone 3 as the mobile device M are perpendicular one another.

FIG. 7 is a view taken from a front side of a mobile device M according to the second embodiment. FIG. 8 is a view taken from a back side of the mobile device according to the second embodiment. FIG. 9 is a cross-sectional view taken on line IX-IX of FIG. 7 of the mobile device M according to the second embodiment.

As illustrated in FIG. 7, the smartphone 3 includes a casing 300 and a display panel 310. Also, as illustrated in FIG. 8, the smartphone 3 includes an accommodation section 400a accommodating the first battery 20a, which is an electrolyte battery having a liquid electrolyte, and an accommodation section 400b accommodating the second battery 20b, which is an all-solid battery having a solid electrolyte, a coupling portion 410a electrically coupled to the first battery 20a accommodated in the accommodation section 400a, and a coupling portion 410b electrically coupled to the second battery 20b accommodated in the accommodation section 400b.

As illustrated in FIGS. 7 to 9, the casing 300 has wall sections 303, 304, and 306, and one side that is open. The wall section 306 is positioned so as to be opposed to the open face, which is one open side of the casing 100. The wall section 303 is positioned in the +Y-direction of the casing 100. The wall section 304 is positioned in the −Y-direction of the casing 100. Further, although the drawings are omitted in the FIGS. 7 to 9, the casing 300 includes wall sections positioned facing each other in the X-axis direction. That is to say, the shape of the casing 300 is substantially a cuboid having one open side.

Also, the casing 300 is provided with the display panel 310 on the opening face facing the wall section 306 in the Z-axis direction. The display panel 310 includes a display section 341 and a sensor section 342 laminated with the display section 341. The display section 341 is formed by including a liquid crystal panel, an electronic paper panel, an organic electroluminescence panel, or the like. Also, the sensor section 342 functions as an operation section that receives operation by a user. A resistive film sensor, an electrostatic capacitance sensor, a surface acoustic wave sensor, or the like is applied to the sensor section 342. That is to say, the display panel 310 according to the present embodiment is a so-called touch panel in which the display section 341 and the sensor section 342 corresponding to an operation switch are integrated.

The casing 300 of the smartphone 3, which is configured as described above is provided with the display panel 310, the drive unit Dry, and the accommodation sections 400a and 400b.

Specifically, as illustrated in FIG. 9, the accommodation section 400a that fixedly accommodates the first battery 20a and the accommodation section 400b that fixedly accommodates the second battery 20b are disposed in line in a contact state with an inner face 306a of the wall section 306 of the casing 300. Also, respective openable/closable lids not illustrated in the figure may be disposed on the wall section 306 in contact with the accommodation sections 400a and 400b. A circuit substrate 312 on which the drive unit Dry is implemented is positioned in the +Z-direction of the accommodation sections 400a and 400b, and the display panel 310 is positioned in the +Z-direction of the circuit substrate 312.

Figure 10:
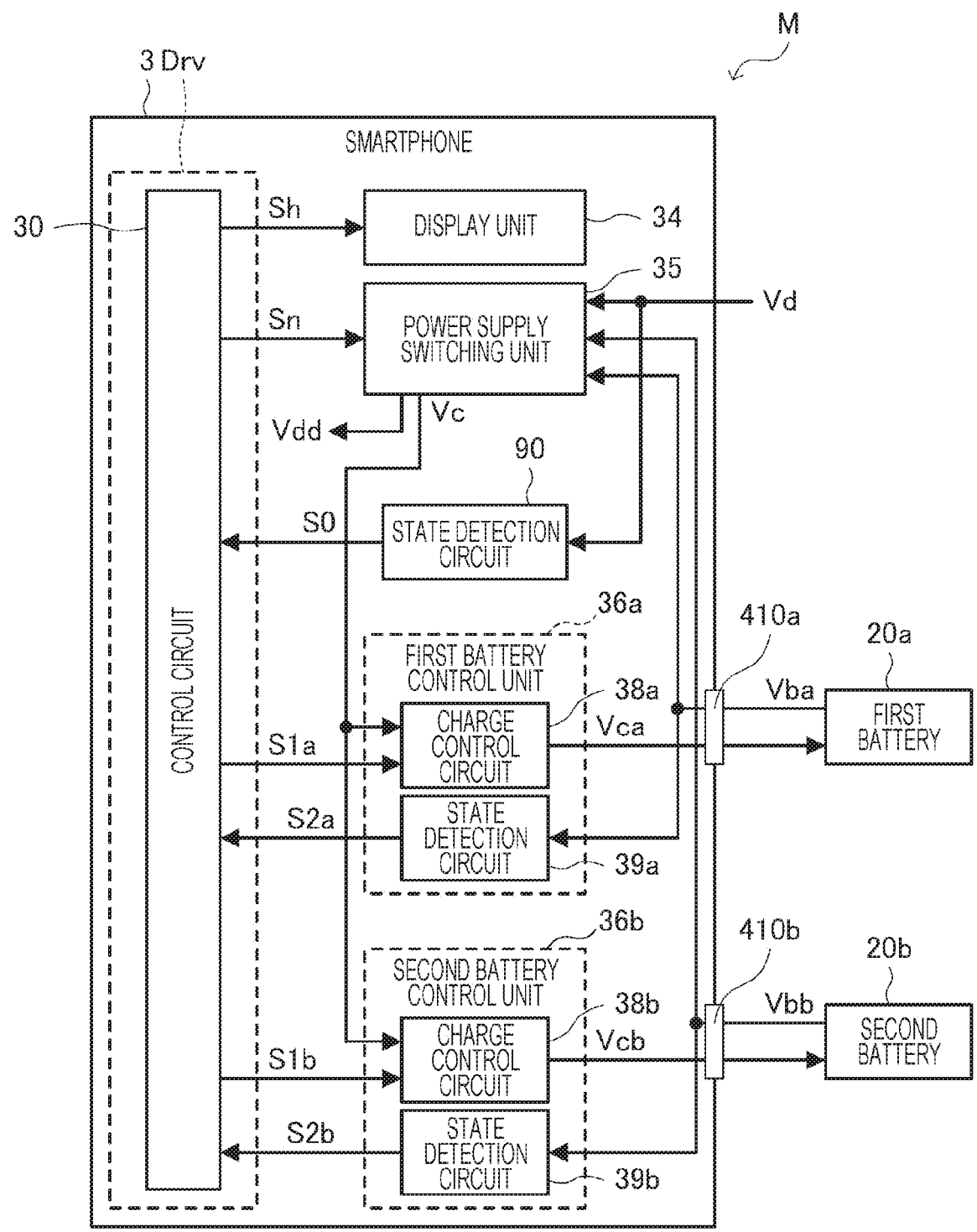
FIG. 10 is a diagram illustrating the functional configuration of the mobile device according to the second embodiment.

FIG. 10 is a diagram illustrating the functional configuration of the mobile device M according to the second embodiment. As illustrated in FIG. 10, the smartphone 3, as the mobile device M, includes a control circuit 30, a display unit 34, a power supply switching unit 35, a first battery control unit 36a, and a second battery control unit 36b.

The control circuit 30 generates and outputs various control signals for controlling drive of the smartphone 3. The control circuit 30 includes, for example, a CPU (central processing unit). In this regard, instead of the CPU or in addition to the CPU, the control circuit 10 may include at least any one of a DSP (digital signal processor), an ASIC (application specific integrated circuit), a PLD (programmable logic device), and an FPGA (field programmable gate array).

The control circuit 10 generates the display control signal Sh for controlling display of various kinds of information in the display unit 34 and outputs the signal to the display unit 34. The display unit 34 displays various kinds of information, such as the operation information, the state information, and the like of the mobile device M in accordance with the display control signal Sh. Thereby, the user is informed of the information including the operation and the state of the mobile device M. The display unit 34 includes the above-described display panel 310, and the like. Here, the display unit 34 is an example of the drive circuit according to the second embodiment.

Also, the control circuit 10 generates the power source selection signal Sn for controlling switching of the supply source of the power source voltage supplied to the smartphone 3 and outputs the signal to the power supply switching unit 35.

The power supply switching unit 35 receives input of the voltage Vba supplied from the first battery 20*a* via the coupling portion 410*a* and the voltage Vbb supplied from the second battery 20*b* via the coupling portion 410*b*. Further, the power supply switching unit 35 receives input of the voltage Vd from the AC adapter disposed outside the mobile device M via the DC jack 108. That is to say, the smartphone 3 receives input of the voltage Vd from an external power source via the AC adapter and the DC jack 108. The power supply switching unit 35 selects any one of the voltages Vba, Vbb, and Vd based on the power source selection signal Sn, and supplies the voltage to each section of the smartphone 3 as the voltage Vdd, which is the power source voltage to the smartphone 3. Also, the power supply switching unit 35 generates the voltage Vc for charging the first battery 20*a* and the second battery 20*b* based on the voltage Vd and outputs the voltage to the first battery control unit 36*a*, and the second battery control unit 36*b*. In this regard, the detailed configuration of the power supply switching unit 35 is the same as that of the power supply switching unit 15 in the first embodiment, and thus the detailed description will be omitted.

The smartphone 3 includes a state detection circuit 90 that detects the state of the external power source, to which the smartphone 3 is electrically coupled, and generates and outputs the state signal S0 indicating a detection result. The control circuit 10 receives input of the state signal S0 from the state detection circuit 90. The state detection circuit 90 has the same configuration as that of the state detection circuit 80 in the first embodiment. Accordingly, the detailed description will be omitted of the state detection circuit 90.

Also, the control circuit 30 generates the control signal S1*a* for controlling the first battery control unit 36*a* and outputs the signal to the first battery control unit 36*a*. Also, the control circuit 30 receives input of the state signal S2*a* from the first battery control unit 36*a*. The first battery control unit 36*a* includes a charge control circuit 38*a* for controlling charging of the first battery 20*a*, and a state detection circuit 39*a* for detecting the state of the first battery 20*a* and generating and outputting the state signal S2*a* indicating a detection result. Here, the configuration of the charge control circuit 38*a* included in the first battery control unit 36*a* is the same as that of the charge control circuit 18*a* in the first embodiment, and the configuration of the state detection circuit 39*a* is the same as that of the state detection circuit 19*a* in the first embodiment. Accordingly, the detailed descriptions will be omitted of the charge control circuit 38*a* and the state detection circuit 39*a*.

Also, the control circuit 30 generates the control signal S1*b* for controlling the second battery control unit 36*b* and outputs the signal to the second battery control unit 36*b*. Also, the control circuit 30 receives input of the state signal S2*b* from the second battery control unit 36*b*. The second battery control unit 36*b* includes a charge control circuit 38*b* for controlling charging of the second battery 20*b*, and a state detection circuit 39*b* for detecting the state of the second battery 20*b* and generating and outputting the state signal S2*b* indicating a detection result. Here, the configuration of the charge control circuit 38*b* included in the second battery control unit 36*b* is the same as that of the charge control circuit 18*b* in the first embodiment, and the configuration of the state detection circuit 39*b* is the same as that of the state detection circuit 19*b* in the first embodiment. Accordingly, the detailed descriptions will be omitted of the charge control circuit 38*b* and state detection circuit 39*b*.

Also, the control circuit 30 may obtain the information on the first battery 20*a* and the second battery 20*b* accommodated in the accommodation sections 400*a* and 400*b* respectively based on the state signal S2*a* output from the state detection circuit 39*a* and the state signal S2*b* output from the state detection circuit 39*b*, and may display the information to the display unit 34. Further, the control circuit 30 may display to the display unit 34 whether the power supplied to each section of the smartphone 3 is the power in accordance with the voltage Vba output from the first battery 20*a* or the power in accordance with the voltage Vbb output from the second battery 20*b* based on the power source selection signal Sn.

Also, the control circuit 30 included in the smartphone 3 corresponds to the control circuit 10 of the mobile printer 1 in the first embodiment.

It is possible for the smartphone 3 as the mobile device M configured as described above in the second embodiment to achieve the same advantages as those of the mobile printer 1 as the mobile device M in the first embodiment.

3. Other Embodiments

The descriptions have been given of the portable mobile printer 1 as the mobile device M according to the first embodiment described above and the smartphone 3 as the mobile device M according to the second embodiment. However, the mobile device M ought to be a portable device driven by a battery, and the present disclosure may be applied to various mobile devices M, for example, a tablet terminal, a mobile phone, a computer, a digital audio player, and the like. In such cases, it becomes possible to achieve the same advantages as those of the first embodiment and the second embodiment.

In the above, the descriptions have been given of the embodiments and the variations. However, the present disclosure is not limited to those embodiments, and it is possible to carry out the present disclosure in various modes without departing from the spirit and scope of the disclosure. For example, it is possible to suitably combine the embodiments described above.

The present disclosure includes substantially the same configuration as those described in the embodiments (for example, the configuration having the same functions, methods, and results, or the configuration having the same purposes and advantages). Also, the present disclosure includes the configuration in which unessential components described in the embodiments are replaced. Also, the present disclosure includes the configuration that is possible to achieve the same advantages or the same purposes as those described in the embodiments. Also, the present disclosure includes the configuration in which publicly known techniques are added to the configuration described in the embodiments.

What is claimed is:
1. A mobile device comprising:
a drive circuit driven based on power output from a power source;

a first coupling portion configured to electrically couple a first battery being an electrolyte battery having a liquid electrolyte as the power source to the drive circuit; and a second coupling portion configured to electrically couple a second battery being an all-solid battery having a solid electrolyte as the power source to the drive circuit.

2. The mobile device according to claim 1, further comprising:

a first accommodation section configured to accommodate the first battery; and a second accommodation section configured to accommodate the second battery.

3. The mobile device according to claim 2, wherein when the first battery is accommodated in the first accommodation section, and the second battery is accommodated in the second accommodation section, at least one of the first battery and the second battery is not electrically coupled to the drive circuit.

4. The mobile device according to claim 1, further comprising:

an information section configured to inform whether the power source electrically coupled to the drive circuit is the first battery or the second battery.

5. The mobile device according to claim 1, further comprising:

a control circuit configured to control driving of the drive circuit, wherein when the drive circuit is driven based on power output from the first battery, the control circuit controls the drive circuit in a first drive state, and when the drive circuit is driven based on power output from the second battery, the control circuit controls the drive circuit in a second drive state different from the first drive state.

6. The mobile device according to claim 1, wherein the first coupling portion and the second coupling portion are not electrically coupled.

7. The mobile device according to claim 1, further comprising:

a first detection circuit configured to detect a coupling of the first battery to the first coupling portion;

a second detection circuit configured to detect a coupling of the second battery to the second coupling portion; and a selection circuit configured to select the power source to be used for driving the drive circuit based on a detection result of the first detection circuit and a detection result of the second detection circuit.

8. The mobile device according to claim 7, further comprising:

a third detection circuit configured to detect a coupling to an external power source, wherein the selection circuit selects the power source to be used for driving the drive circuit based on the detection result of the first detection circuit, the detection result of the second detection circuit, and a detection result of the third detection circuit.

9. The mobile device according to claim 7, wherein when the first detection circuit detects the coupling of the first battery to the first coupling portion, and the second detection circuit detects the coupling of the second battery to the second coupling portion, the selection circuit selects the second battery as the power source to be used for driving the drive circuit.

\* \* \* \* \*